United States Patent [19]
George et al.

[11] Patent Number: 5,918,363
[45] Date of Patent: Jul. 6, 1999

[54] METHOD FOR MARKING FUNCTIONAL INTEGRATED CIRCUIT CHIPS WITH UNDERFILL MATERIAL

[75] Inventors: Reed Allen George, Chandler, Ariz.; Frank Joseph Juskey, Coral Springs; Richard Lee Mangold, Lake Worth, both of Fla.

[73] Assignee: Motorola, Inc., Schaumburg, Ill.

[21] Appl. No.: 08/655,301

[22] Filed: May 20, 1996

[51] Int. Cl.[6] ........................................ H05K 3/30
[52] U.S. Cl. ............................... 29/832; 29/417; 29/840; 29/841
[58] Field of Search ................ 29/848, 832, 415, 29/417, 840, 841; 257/737, 778; 427/96

[56] References Cited

U.S. PATENT DOCUMENTS

| | | | |
|---|---|---|---|
| 4,157,932 | 6/1979 | Hirata | 156/310 |
| 4,172,907 | 10/1979 | Mones et al. | 427/96 |
| 5,218,234 | 6/1993 | Thompson et al. | 257/787 |
| 5,258,648 | 11/1993 | Lin | 257/778 |
| 5,274,913 | 1/1994 | Grebe et al. | 29/840 |
| 5,386,624 | 2/1995 | George et al. | 29/832 |
| 5,659,203 | 8/1997 | Call et al. | 257/778 |
| 5,670,826 | 9/1997 | Bessho et al. | 257/737 |
| 5,677,575 | 10/1997 | Maeta et al. | 257/778 |
| 5,685,885 | 11/1997 | Khandros et al. | 29/841 |

FOREIGN PATENT DOCUMENTS 62-145827  6/1987  Japan .

OTHER PUBLICATIONS

Shell Resins and Related Products Physical Porperties Guide, Shell Chemical Compnay, May 1994.
HYSOL® FP4510* Flip Chip Encapsulant Preliminary Bulletin, Dexter Electronics Materials Division, Aug. 1991.

*Primary Examiner*—Peter Vo
*Assistant Examiner*—Kevin G. Vereene
*Attorney, Agent, or Firm*—James A. Lamb

[57] ABSTRACT

A method for selectively marking integrated circuit chips (205, 210) formed on a wafer (200) includes the steps of testing the integrated circuit chips (205, 210)) of the wafer (200) to determine whether the integrated circuit chips (205, 210) are functional, dispensing underfill material (215) only on functional integrated circuit chips (205), and separating, subsequent to the dispensing step, the wafer (200) into individual integrated circuit chips (205, 210). The functional integrated circuit chips (205) are marked with the underfill material (215), while nonfunctional integrated circuit chips (210) are not marked with the underfill material (215).

13 Claims, 3 Drawing Sheets

METHOD FOR MARKING FUNCTIONAL INTEGRATED CIRCUIT CHIPS WITH UNDERFILL MATERIAL

FIELD OF THE INVENTION

This invention relates in general to methods of testing and marking integrated circuit chips, and more specifically to a method for marking functional integrated circuit chips that are mounted with flip chip technology.

BACKGROUND OF THE INVENTION

Integrated circuit chips are generally formed by growing a layer of silicon dioxide on the surface of a polished silicon wafer, which is typically doped with a p-type impurity such as boron. Photolithographic techniques are thereafter employed to remove the oxide in selected regions where circuit elements such as transistors will be placed. In these regions, impurities are deposited on the surface of the wafer to form an n-type highly conductive layer, referred to as a buried layer, and an epitaxial layer is deposited. Successive oxide growths, photolithography steps, and diffusions are carried out to form integrated circuit elements, after which metallization is selectively applied to form electrical terminals and circuit interconnections. When "flip-chips" are to be formed, the electrical terminals are bumped with solder.

The chips on the wafer are electrically tested to determine whether they are functional or nonfunctional. Conventionally, the nonfunctional chips are marked with ink, subsequent to which the wafer is separated into individual integrated circuit chips. The nonfunctional chips, recognizable because of the deposited ink, are discarded. The functional chips are then mounted to substrates and electrically coupled thereto. After a functional chip has been electrically connected to a substrate, an underfill material is dispensed around the perimeter of the chip. The underfill material is intended to spread beneath the bonded integrated circuit chip. Thereafter, the underfill material is solidified in a curing process to provide mechanical support to the electrical connections.

However, the underfill material does not always sufficiently spread between the electrical connections of the chip and substrate. Therefore, the mechanical support provided by the underfill material may be only minimal, resulting in breakage of the electrical connections and malfunction of the device in which the chip is used. Furthermore, the numerous steps required for processing an integrated circuit chip can be time-consuming and inefficient.

Thus, what is needed is an improved method for processing an integrated circuit chip. The method should require fewer steps and provide a more evenly distributed underfill between the integrated circuit chip and substrate to which it is mounted.

DESCRIPTION OF A PREFERRED EMBODIMENT

Figure 1:
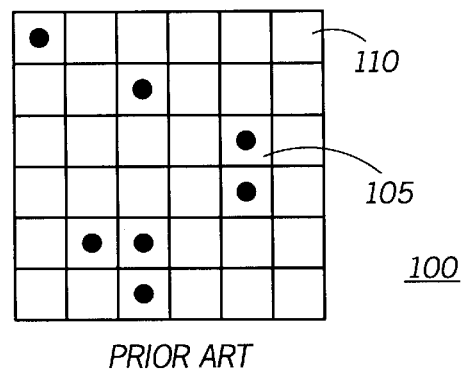
FIG. 1 is a wafer including nonfunctional integrated circuit chips that have been marked with ink in a conventional manner.

FIG. 1 depicts a wafer 100 on which conventional integrated circuit chips 105, 110 are formed. By way of example, each integrated circuit chip 105, 110 can be formed using conventional integrated circuit techniques in which silicon dioxide layers are grown on the surface of each integrated circuit die. Photolithographic techniques are then employed to remove oxide in selected regions, and impurity atoms are deposited and epitaxial layers are grown on each die of the wafer 100. According to conventional flip-chip technology, terminals are formed and coupled by metallization to the integrated circuit elements, after which the terminals are bumped with an electrically conductive material, such as solder, suitable for bonding to a substrate.

Conventionally, the integrated circuit chips 105, 110 are tested for functionality prior to separation from the wafer 100. As shown in FIG. 1, nonfunctional chips 105 are marked with an ink so that they are recognizable, while functional chips 110 are not marked with the ink. Thereafter, the chips 105, 110 are separated from the wafer 100, and the nonfunctional chips 105 are discarded. The functional chips 110 are then bonded to substrates, after which underfill material is dispensed around the perimeters of the chips 110 to provide mechanical strength.

In prior art processes, the underfill material comprises a low viscosity epoxy that is applied around edges of a bonded integrated circuit chip 110. The epoxy is intended to leak beneath the chip 110 and surround electrical connections between the chip 110 and the substrate (not shown). However, in practicality, the underfill material often does not adequately spread beneath the chip 110. Therefore, the mechanical support provided by the underfill material is minimal, which can result in breakage of the electrical connections. This can cause operational malfunctions of devices, such as selective call receivers, in which inadequately underfilled chips 110 are employed.

Figure 2:
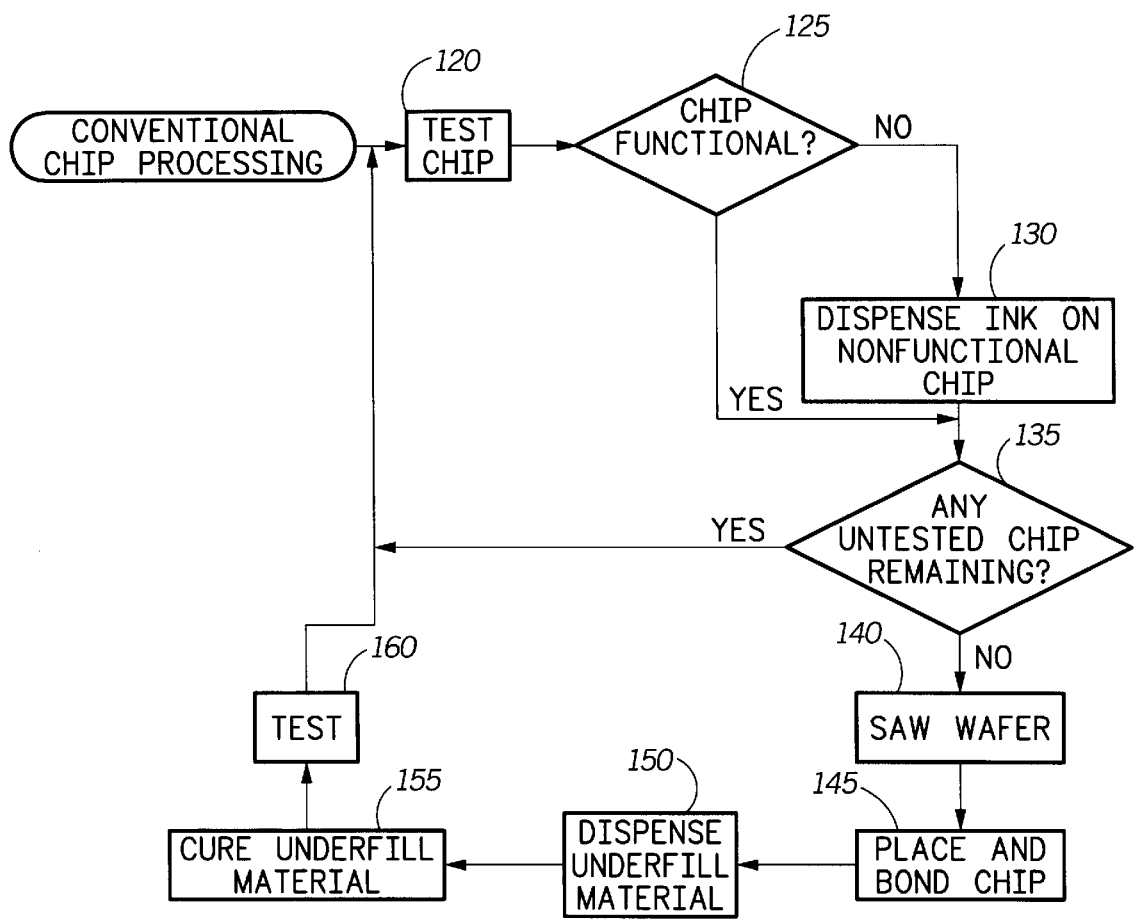
FIG. 2 is a process for marking the nonfunctional integrated circuit chips of FIG. 1 in a conventional manner.

FIG. 2 is a flowchart depicting a method for conventionally processing flip-chip integrated circuit chips 105, 110. At step 120, a chip 105, 110 on the wafer 100 is tested. When, at step 125, the chip is bad, i.e., nonfunctional, ink is dispensed, at step 130, on the nonfunctional chip 105. At step 135, testing continues until all chips 105, 110 of the wafer 100 are tested. Once all chips 105, 110 have been tested and ink has been dispensed on the nonfunctional chips 105, the individual integrated circuit chips 105, 110 are separated from the wafer 100 using a conventional sawing process, at step 140. The nonfunctional integrated circuit chips 105 are discarded, and the functional integrated circuit chips 110 are placed on substrates. The flip-chips 110 are then bonded, at step 145, using a conventional bonding process, such as one in which heat and pressure are applied to form electrical connections between a substrate and a flip-chip 110.

Next, at step 150, a low viscosity epoxy underfill is dispensed at edges of a flip-chip 110, and the underfill material is cured, at step 155. For instance, the underfill material could be thermally cured at 120–130° centigrade for twenty minutes then at 150° centigrade for one hour. The curing process solidifies the underfill material. Thereafter, the chip 110 is again tested, at step 160. Processing of new wafers subsequently begins at step 120.

Because the underfill material is dispensed only around edges of the bonded chip 110, the process of FIG. 2 does not reliably and consistently provide evenly distributed underfills, so inadequate mechanical support for electrical connections can result. Furthermore, the large number of steps involved in the process of FIG. 2 results in a time-consuming and inefficient process.

Figure 3:
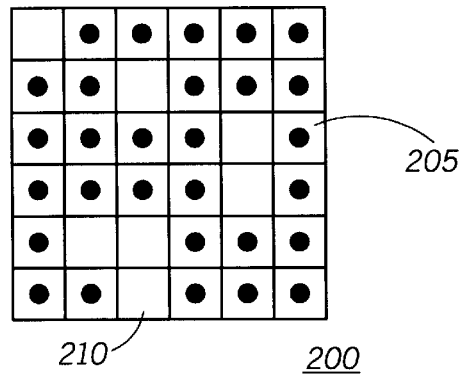
FIG. 3 is a wafer including functional integrated circuit chips on which underfill material has been dispensed in accordance with the present invention.

FIG. 3 depicts a wafer 200 processed in accordance with the present invention. The wafer 200 includes integrated circuit chips 205, 210, which are preferably formed using flip-chip technology so that the terminals of the chips 205, 210 are bumped with an electrically conductive material, such as solder. The wafer 200 is different than conventional wafers 100 in that nonfunctional integrated circuit chips 210 are left unmarked, while functional integrated circuit chips 205 are marked with underfill material to indicate that they are functional.

Figure 4:
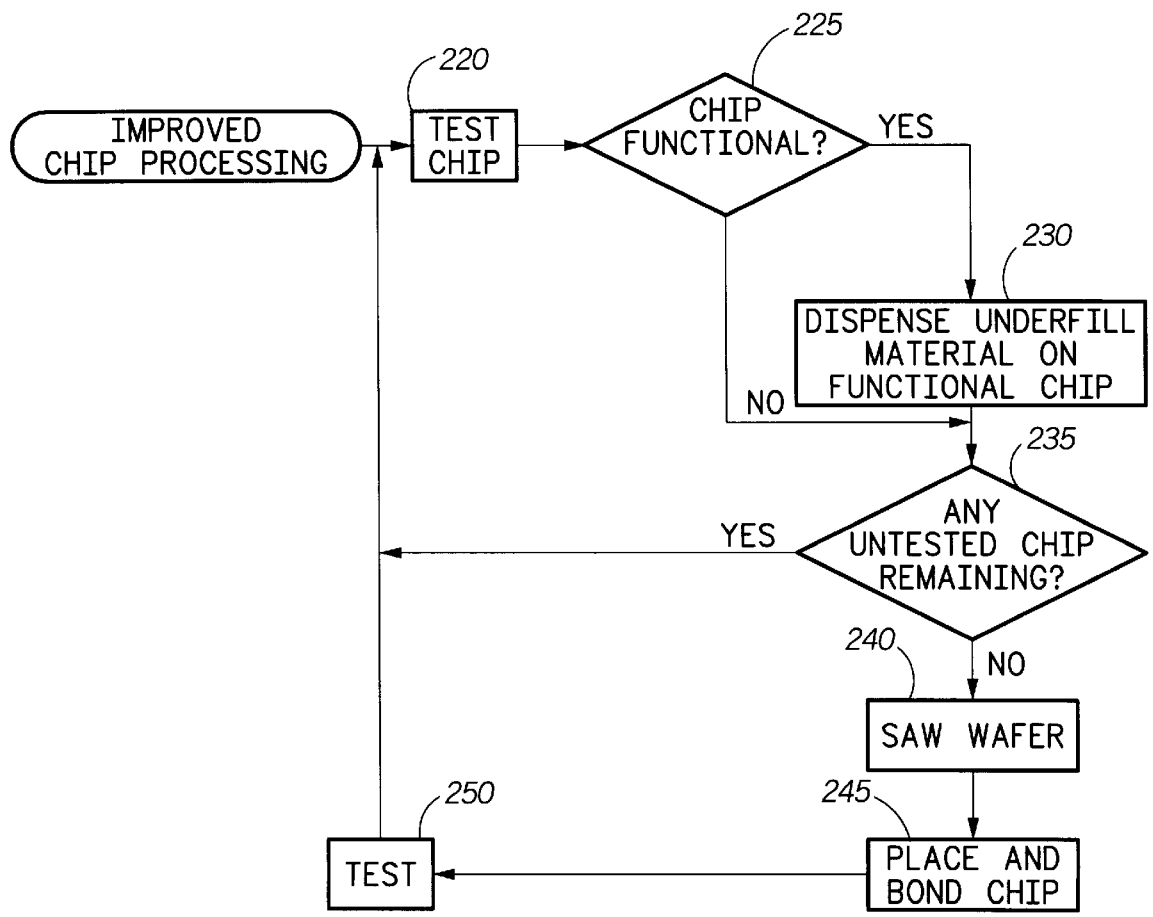
FIG. 4 is a process for marking the functional integrated circuit chips of FIG. 1 with the underfill material in accordance with the present invention.

Referring next to FIG. 4, a flowchart illustrates a method for processing the integrated circuit chips 205, 210 according to the present invention. At step 220, the chips 205, 210 are tested to determine functionality. When, at step 225, a chip is determined to be functional, i.e., good, the underfill material is dispensed, at step 230, on the functional chip 205. The underfill material preferably comprises an epoxy to which a solvent has been added to lower the viscosity so that the underfill material is suitable for dispensing. The solvent can be, for instance, a ketone such as acetone or methyl ethyl ketone. Underfill material that is suitable for purposes of the present invention includes, for instance, Hysol™ FP4510 Flip Chip Encapsulant by Dexter Corporation. After the underfill is dispensed, at step 230, the solvent will evaporate, leaving an epoxy, such as a novolac epoxy, that is solid at room temperature.

When, at step 235, all chips 205, 210 have been tested and underfill material has been dispensed on all functional chips 205, the wafer 200 is separated into individual integrated circuit chips 205, 210 in a conventional sawing process, at step 240. Although the amount of underfill material dispensed on a good chip 205 can vary according to the size of the chips 205, 210 on the wafer, the dispensed underfill material preferably remains within the chip boundaries so that it does not interfere with the sawing process.

Furthermore, as mentioned above, evaporation of the solvent within the underfill material results in a solid. Therefore, debris generated during the sawing process is advantageously prevented from adhering to the underfill material.

The functional chips 205, which have preferably been bumped according to flip-chip technology, are then bonded, at step 245, to substrates, after which they are again tested, at step 250. The bonding process, for instance, can include the application of heat and pressure to bond the bumped circuitry of a chip 205 to a substrate, thereby forming electrical connections between the chip 205 and substrate. New wafers received for processing are subsequently processed beginning at step 220.

Figure 5:
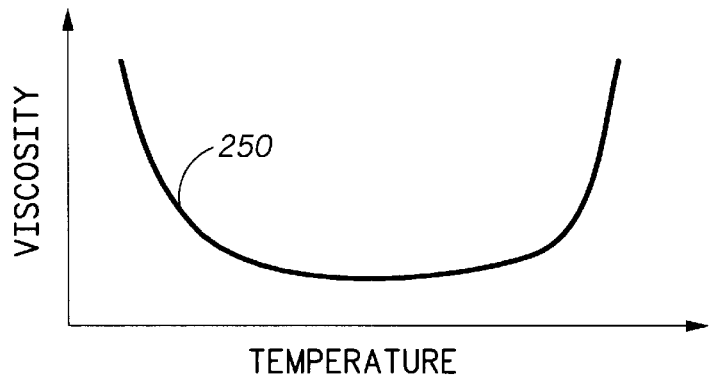
FIG. 5 is a diagram illustrating the relationship between viscosity and temperature with respect to the underfill material dispensed on a functional integrated circuit chip in accordance with the present invention.

FIG. 5 depicts a relationship of temperature and viscosity with respect to an underfill material dispensed on functional chips 205 according to the present invention. A "bathtub" curve 250 illustrates the decrease in viscosity of the underfill material as the temperature rises. Therefore, the underfill material, which is a solid at room temperature, liquefies as the temperature rises. As the underfill material is heated further and cured, the viscosity once again rises, and the underfill material solidifies again.

As shown in FIG. 5, the underfill material liquefies when heated during the bonding process. Therefore, the bumps of the chip 205 are able to push the underfill material out from between the bumps and the substrate terminals so that the electrical connections can be formed. The amount of underfill material dispensed on a good chip 205 should be sufficient to evenly fill between the electrical connections. However, it is desirable that the amount of underfill material be adjusted so that little, if any, of the underfill material squeezes from beneath the chip 205 during the bonding process.

It will be appreciated that other temperature and viscosity relationships can describe different materials suitable for use as an underfill material in accordance with the present invention. For instance, the underfill material could comprise a thermoplastic material, e.g., a low density polyethylene or a conventional hot melt material. A thermoplastic underfill material would remain in a solid state at room temperature, then liquefy as heated. Subsequent cooling of the material would again cause it to solidify. When such a material is used, the material is preferably heated so that it is in a liquid state while being dispensed onto functional integrated circuit chips 205.

According to the present invention, underfill material is conveniently dispensed to mark good integrated circuit chips 205 prior to separation from the wafer 200. Therefore, the conventional steps of dispensing ink to mark bad chips, dispensing underfill material around bonded chips, and curing the dispensed underfill are eliminated to provide a more streamlined, efficient process. Furthermore, because the underfill material is applied to the underside of a chip 205 before it is ever bonded, the underfill material dispensed in accordance with the present invention is much more likely to provide evenly distributed mechanical support surrounding the electrical connections. As a result, the chances of the electrical connections breaking are reduced, and the reliability of devices including the chips 205 is increased.

Figure 6:
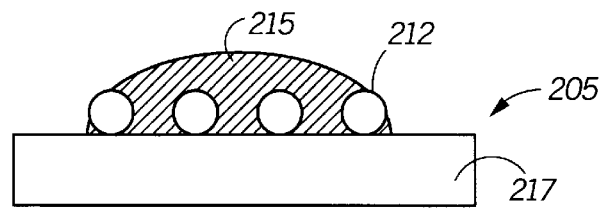
FIG. 6 is a side view of a functional integrated circuit chip after separation from the wafer of FIG. 3 in accordance with the present invention.

FIG. 6 is a side view of a functional integrated circuit chip 205 after separation from the wafer 200 (FIG. 3). The integrated circuit chip 205 comprises a die 217 that has been processed according to flip-chip technology to provide electrically conductive bumps 212 at appropriate circuit terminals. Additionally, to indicate that the chip 205 is functional, a suitable amount of underfill material 215 has been previously dispensed on the bumped surface of the die 217. As mentioned, the amount of underfill material 215 is preferably adjusted to prevent interference with the sawing process while providing an even and adequate distribution of underfill material 215 during the later bonding process.

Figure 7:
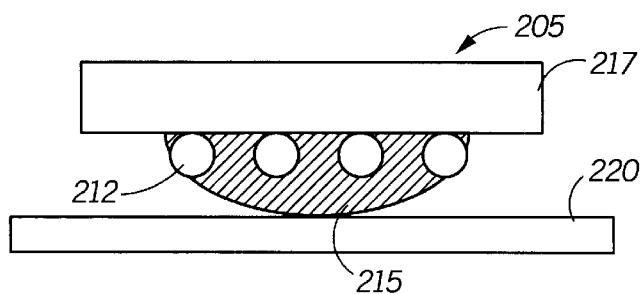
FIG. 7 is a side view of the functional integrated circuit chip of FIG. 6 mounted on a substrate in accordance with the present invention.
Figure 8:
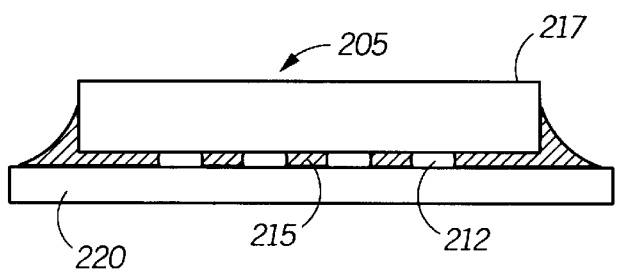
FIG. 8 is a side view of the functional integrated circuit chip of FIG. 6 after bonding to the substrate in accordance with the present invention.

FIG. 7 is a side view of the chip 205 when placed on a substrate 220, and FIG. 8 is a side view of the chip 205 after bonding with the substrate 220. In FIG. 8, it can be seen that the underfill material 215 has been pushed into areas surrounding the electrical connections between terminals (not shown) of the substrate 220 and the electrically conductive bumps 212 of the chip 205.

Figure 9:
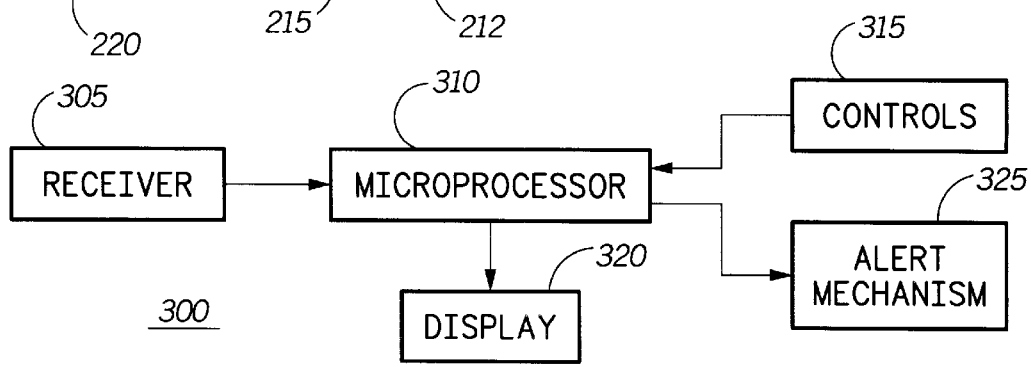
FIG. 9 is an electrical block diagram of a selective call receiver including the functional integrated circuit of FIG. 6 in accordance with the present invention.

Referring next to FIG. 9, an electrical block diagram of a selective call receiver 300 is shown. The selective call receiver 300 includes components, such as a receiver 305 and a microprocessor 310, for receiving and decoding a radio signal. Controls 315 provide user-initiated signals to the microprocessor 310, a display 320 presents received information, and an alert mechanism 325 announces reception of information. According to the present invention, at least one component, e.g., the microprocessor 310, comprises an integrated circuit chip 205 for performing processing functions of the selective call receiver 300. Because the integrated circuit chip 205 is processed according to the improved method of FIG. 4, the selective call receiver 300 can be manufactured using fewer steps, resulting in less expense. Additionally, the selective call receiver 300 is less likely to fail due to breakage of electrical connections formed between a receiver substrate and an integrated circuit chip 205.

In summary, the method as described above provides an efficient way to process integrated circuit chips. Specifically, functional integrated circuit chips are marked with underfill material prior to separation from the wafer, while nonfunctional integrated circuit chips are not marked at all. Thereafter, the separated chips on which underfill material has already been dispensed are bonded to substrates. During the bonding process, the underfill material flows between the electrical connections formed between a chip and a substrate. Once the underfill material solidifies, it provides mechanical support to advantageously prevent breakage of the electrical connections.

Conversely, in prior art processes, ink is dispensed on the wafer to mark nonfunctional chips. Once the chips are separated, the good chips are bonded to substrates. Only after a chip has been bonded is underfill material dispensed around the bonded chip. The underfill material is intended to leak beneath the bonded chip and provide mechanical support. However, the underfill material does not always distribute adequately beneath the chip, so the mechanical support is often insufficient. Furthermore, this prior art process requires a greater number of steps since the steps of marking selected chips and of dispensing the underfill material occur separately, and since the underfill material in prior art processes must be separately cured.

Another advantage of the present invention is that the underfill material can be manufactured in a variety of colors, from black to clear. When, for instance, the underfill material is mounted to a glass substrate, it may be desirable to use a clear epoxy underfill material so that the circuitry remains visible through the underfill material. Colored underfill material could also be used to indicate device type. By way of example, an integrated circuit chip for use as a microprocessor could be marked with orange underfill, while an integrated circuit chip for use as a decoder could be marked with green underfill. The color-coded chips would be easily recognized in a factory setting, and erroneous bonding of incorrect devices would be minimized.

It will be appreciated by now that there has been provided an improved method for processing an integrated circuit chip. The method requires fewer steps than prior art processes and provides a more evenly distributed underfill between the integrated circuit chip and substrate to which it is bonded.

What is claimed is:

1. A method for selectively marking integrated circuit chips formed on a wafer, the method comprising the steps of:

testing the integrated circuit chips of the wafer to determine which are functional integrated circuit chips, and which are non-functional integrated circuit chips; and marking each of the functional integrated circuit chips on the wafer by dispensing an underfill material thereon and leaving the non-functional integrated circuit chips unmarked by underfill material; and separating from the wafer subsequent to the dispensing step, the functional integrated circuit chips into individual functional integrated circuit chips each having an underfill material marked thereon.

2. The method of claim 1, wherein the marking step comprises the step of:

dispensing the underfill material onto the functional integrated circuit chips.

3. The method of claim 1, further comprising the steps of:

identifying an individual circuit chip as an individual functional circuit chip from the underfill material marked in the marking step placing the individual functional circuit chip, onto a substrate; and bonding the individual functional circuit chip to the substrate such that the underfill material dispensed on the individual functional circuit chip spreads around electrical connections formed between the individual functional circuit chip and the substrate.

4. The method of claim 1, further comprising the step of:

bumping, prior to the marking step, the integrated circuit chips with solder.

5. The method of claim 1, further comprising, subsequent to the separating step, the step of:

discarding nonfunctional integrated circuit chips that are not marked with the underfill material.

6. The method of claim 1, wherein the separating step comprises the step of:

sawing the wafer into the individual integrated circuit chips.

7. A method for selectively marking integrated circuit chips formed on a wafer, the method comprising the steps of:

testing the integrated circuit chips of the wafer to determine which are functional integrated circuit chips;

dispensing an underfill material only on integrated circuit chips determined to be functional in the step of testing while in wafer form;

separating, subsequent to the dispensing step, the wafer into individual integrated circuit chips, of which the functional integrated circuit chips are marked with the underfill material and nonfunctional integrated circuit chips are not marked with the underfill material while in wafer form; and bonding a functional integrated circuit chip to a substrate such that the underfill material dispensed on the function integrated circuit chip spreads around electrical connections formed between the functional chip and the substrate.

8. The method of claim 7, wherein the bonding step comprises the steps of:

placing the functional integrated circuit chip on the substrate;

applying heat and pressure to the functional integrated circuit chip to bond the functional chip to the substrate.

9. A method of preparing an integrated circuit chip by a process comprising the steps of:

forming the integrated circuit chip on a wafer;

testing the integrated circuit chip to determine whether the integrated circuit chip is functional;

dispensing, an underfill material on the integrated circuit chip while in wafer form only in response to determining in the step of testing that the integrated circuit chip is functional; and separating, subsequent to the dispensing step, the integrated circuit chip from the wafer.

10. The method of claim 9, wherein the process further comprises the steps of:

bonding, in response to the integrated circuit chip having underfill material dispensed thereon in the step of, the integrated circuit chip to a substrate such that the underfill material spreads around electrical connections formed between the integrated circuit chip and the substrate.

11. The method of claim 9, wherein the separating step of the process comprises the step of:

sawing the wafer into individual integrated circuit chips, functional ones of which are marked with the underfill material and nonfunctional ones of which are not marked with the underfill material.

12. A method of fabricating a selective call receiver including components for receiving and decoding a radio signal, wherein at least one component of the receiver comprises the integrated circuit chip, said method comprising the steps of:

forming the integrated circuit chip on a wafer;

testing the integrated circuit chip while in wafer form to determine whether the integrated circuit chip is functional;

dispensing an underfill material on the integrated circuit while in wafer form only in response to determining in the step of testing that the integrated circuit chip is functional;

separating, subsequent to the dispensing step, the integrated circuit chip from the wafer; and bonding in response to the integrated circuit chip having had underfill material dispensed thereon in the step of dispensing the integrated circuit chip to a substrate included in the selective call receiver such that the underfill material spreads around electrical connections formed between the integrated circuit chip and the substrate.

13. The selective call receiver of claim 12, wherein the separating step of the process comprises the step of:

sawing the wafer into individual integrated circuit chips, functional ones of which are marked with the underfill material and nonfunctional ones of which are not marked with the underfill material.

* * * * *

UNITED STATES PATENT AND TRADEMARK OFFICE
CERTIFICATE OF CORRECTION

PATENT NO. : 5,918,363
DATED : July 6, 1999
INVENTOR(S) : George et al.

It is certified that error appears in the above-indentified patent and that said Letters Patent is hereby corrected as shown below:

Column 8, line 20, delete "selective call receiver" and insert --method--.

Signed and Sealed this

Eighteenth Day of April, 2000

Attest:

Q. TODD DICKINSON

*Attesting Officer*          *Director of Patents and Trademarks*